(12) United States Patent
Cheng et al.

(10) Patent No.: US 11,264,370 B2
(45) Date of Patent: Mar. 1, 2022

(54) LED PACKAGE STRUCTURE

(71) Applicants: LITE-ON OPTO TECHNOLOGY (CHANGZHOU) CO., LTD., Changzhou (CN); LITE-ON TECHNOLOGY CORPORATION, Taipei (TW)

(72) Inventors: Wei-Te Cheng, Taipei (TW); Kuo-Ming Chiu, New Taipei (TW); Kai-Chieh Liang, New Taipei (TW); Jie-Ting Tsai, New Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

(*) Notice: Subject to any disclaimer, the term of this patent is extended or adjusted under 35 U.S.C. 154(b) by 0 days.

(21) Appl. No.: 16/898,576

(22) Filed: Jun. 11, 2020

(65) Prior Publication Data
US 2020/0395515 A1 Dec. 17, 2020

Related U.S. Application Data

(60) Provisional application No. 62/860,883, filed on Jun. 13, 2019.

(30) Foreign Application Priority Data

Apr. 15, 2020 (CN) .......................... 202010296592.1

(51) Int. Cl.
*H01L 25/16* (2006.01)
*H01L 23/485* (2006.01)
(Continued)

(52) U.S. Cl.
CPC .......... *H01L 25/167* (2013.01); *F21V 31/005* (2013.01); *H01L 23/485* (2013.01);
(Continued)

(58) Field of Classification Search
CPC ..... H01L 25/167; H01L 33/405; H01L 33/60; F21V 31/005
See application file for complete search history.

(56) References Cited

U.S. PATENT DOCUMENTS

2008/0061314 A1* 3/2008 Liaw .................. H01L 33/641 257/99
2020/0321491 A1* 10/2020 Hirano ................ H01L 33/0095

FOREIGN PATENT DOCUMENTS

CN 102110764 A 6/2011
CN 103354255 A 10/2013
(Continued)

*Primary Examiner* — Marcos D. Pizarro
*Assistant Examiner* — Antonio B Crite
(74) *Attorney, Agent, or Firm* — Li & Cai Intellectual Property (USA) Office

(57) ABSTRACT

A light-emitting diode (LED) package structure includes a substrate, an LED, a side wall, an encapsulant, and a waterproof protective coating. The LED is disposed on the substrate, the side wall defines a through hole and is disposed on the substrate, and the LED is accommodated in the through hole. The encapsulant is filled in the through hole and covers the LED. A heterojunction is disposed between the encapsulant and the side wall, and the waterproof protective coating seals the heterojunction. Furthermore, the encapsulant includes a first fluoropolymer, the waterproof protective coating includes a second fluoropolymer, and the light transmittance of the first fluoropolymer is greater than that of the second fluoropolymer.

16 Claims, 6 Drawing Sheets

(51) Int. Cl.
*F21V 31/00* (2006.01)
*H01L 25/075* (2006.01)
*H01L 33/40* (2010.01)
*H01L 33/50* (2010.01)
*H01L 33/56* (2010.01)
*H01L 33/58* (2010.01)
*H01L 33/60* (2010.01)
*H01L 33/62* (2010.01)
*H01L 23/14* (2006.01)
*H01L 23/498* (2006.01)
*H01L 33/54* (2010.01)

(52) U.S. Cl.
CPC ........ *H01L 25/0753* (2013.01); *H01L 33/405* (2013.01); *H01L 33/502* (2013.01); *H01L 33/505* (2013.01); *H01L 33/56* (2013.01); *H01L 33/58* (2013.01); *H01L 33/60* (2013.01); *H01L 33/62* (2013.01)

(56) References Cited

FOREIGN PATENT DOCUMENTS

| | | | |
|---|---|---|---|
| CN | 104813492 | A | 7/2015 |
| CN | 106488964 | A | 3/2017 |
| CN | 109314166 | A | 2/2019 |
| JP | 201142762 | A | 3/2011 |
| JP | 2011199219 | A | 10/2011 |
| KR | 1020120013065 | A | 2/2012 |
| KR | 1020140057931 | A | 5/2014 |
| KR | 102029795 | B1 * | 10/2019 |
| TW | 201036481 | A1 | 10/2010 |

* cited by examiner

LED PACKAGE STRUCTURE

CROSS-REFERENCE TO RELATED PATENT APPLICATION

This application claims the benefit of priority to China Patent Application No. 202010296592.1, filed on Apr. 15, 2020 in People's Republic of China. The entire content of the above identified application is incorporated herein by reference.

This application claims priority from the U.S. Provisional Patent Application Ser. No. 62/860,883 filed Jun. 13, 2019, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light-emitting diode (LED) package structure, and more particularly to an LED package structure having side walls.

BACKGROUND OF THE DISCLOSURE

With the advancement of LED technology, along with the maturity of related circuit control components and heat dissipation technology, applications of the LED has gradually diversified. The conventional technology of an LED package structure includes a quartz cover, but the refractive index (n) of the quartz cover is 1.45, while that of the air is 1. Thus, the refractive indices of the quartz cover and the LED do not match with each other, causing total reflection and causing a loss of 12% to 15% in the absorption power. The conventional technology of another LED package structure includes a silicon molded package, but the conventional silicon encapsulant is prone to crack under light with a wavelength in the ultra-violet (UV) band, which decreases the reliability. Thus, the another LED package structure is not suitable for environments with high temperature and humidity, and a light transmittance of the silicon encapsulant under light having a wavelength in the UV band is relatively poor, e.g., decreases by about 55% at a 275 nm wavelength.

Therefore, due to the above mentioned reasons, one of the important issues in the industry is to overcome the above mentioned defects through structural design and the improvement of material selection, and to maintain or increase the luminous power of the LED.

SUMMARY OF THE DISCLOSURE

In response to the above-referenced technical inadequacies, the present disclosure provides an LED package structure that has a waterproof protective coating.

In one aspect, the present disclosure provides an LED package structure including a substrate, at least one LED, a side wall, an encapsulant, and a waterproof protective coating. The at least one LED is disposed on the substrate, the side wall defending a through hole is disposed on the substrate, and the at least one LED is accommodated in the through hole. The encapsulant is filled in the through hole and covers the at least one LED. A heterojunction is disposed between the encapsulant and the side wall, and the waterproof protective coating seals the heterojunction. Furthermore, the encapsulant includes a first fluoropolymer, the waterproof protective coating includes a second fluoropolymer, and a light transmittance of the first fluoropolymer is greater than that of the second fluoropolymer.

Preferably, the at least one LED emits light with a wavelength range of 200 nm to 400 nm.

Preferably, the light transmittance of the first fluoropolymer in a wavelength range of 265 nm to 285 nm is greater than 90%, and the light transmittance of the second fluoropolymer in a wavelength range of 265 nm to 285 nm is between 85% and 90%.

Preferably, the first fluoropolymer has the following structure:
$CF_3$—$(CF_2$—$CFCF_2CF_2$—$O$—$CF$—$CF_2)_n$—$CF_3$, and n is a positive integer that is between 25 and $3\times10^5$.

Preferably, the second fluoropolymer has the following structure: $COOH$—$(CF_2$—$CFCF_2CF_2$—$O$—$CF$—$CF_2)_m$—$COOH$, and m is a positive integer that is between 18 and $1.5\times10^5$.

Preferably, the diameter of the through hole increases along with a direction away from the substrate.

Preferably, the side wall has a first surface that is distant from the substrate, a second surface that is close to the substrate, and an inner surface that is connected therebetween. The first surface is higher than the at least one LED.

Preferably, the encapsulant has a dome that protrudes out of the first surface.

Preferably, the waterproof protective coating covers a part of the dome and exposes another part of the dome. More preferably, the dome has a first portion and a second portion, the waterproof protective coating surrounds the second portion and exposes the first portion.

Preferably, the LED package structure further includes a metal reflective layer that is disposed on the inner surface of the side wall.

Preferably, the metal reflective layer extends to the first surface.

Preferably, the package structure has a central area and a peripheral area surrounding the central area, and the waterproof protective coating covers the metal reflective layer and extends to the peripheral area through the heterojunction.

Preferably, an adhesive layer is further included between the second surface of the side wall and the substrate.

Preferably, the side wall further includes an outer surface that is connected between the first surface and the second surface and opposite to the inner surface. The waterproof protective coating covers the outer surface and extends to seal the adhesive layer.

Preferably, the light of the at least one LED is emitted to the waterproof protective coating and then reflected to the metal reflective layer by the waterproof protective coating.

Preferably, the LED package structure further includes an anti-oxidation layer that is disposed on the metal reflective layer.

Preferably, the material of the anti-oxidation layer is selected from at least one of silica, hafnium dioxide, zirconium dioxide, and magnesium fluoride.

Preferably, the side wall is formed by stacking a plurality of reflecting parts, and the widths of the reflecting parts that are closer to the waterproof protective coating are smaller than the widths of the reflecting parts that are closer to the substrate.

Preferably, the material of the side wall is a metal with less activity than chromium or an alloy of the metal.

Preferably, the material of the side wall is nickel/gold alloy.

One of the advantages of the present disclosure is that the LED package structure is able to effectively improve on the problem of wear and tear caused by the penetration of water vapor between the encapsulant and the side wall, and increase the luminous power, through the technical features of "the waterproof protective coating sealing the heterojunction" and "the material of the encapsulant including a first fluoropolymer, the material of the waterproof protective coating including a second fluoropolymer, and the light transmittance of the first fluoropolymer being greater than the light transmittance of the second fluoropolymer".

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
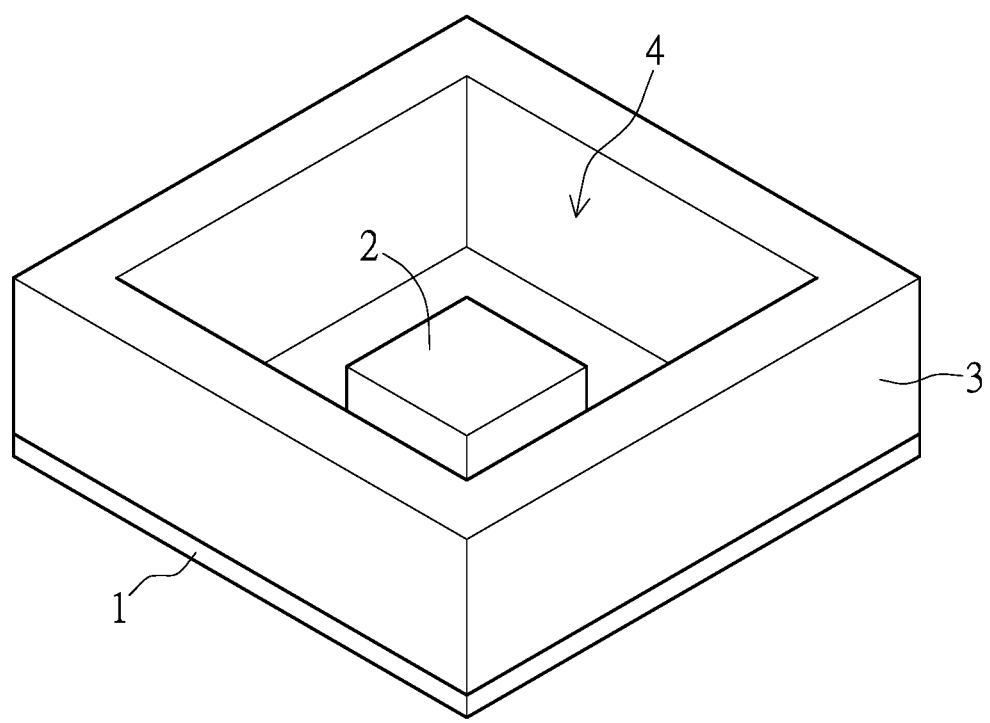
FIG. 1 is a perspective schematic view of an LED package structure of the present disclosure.
Figure 2:
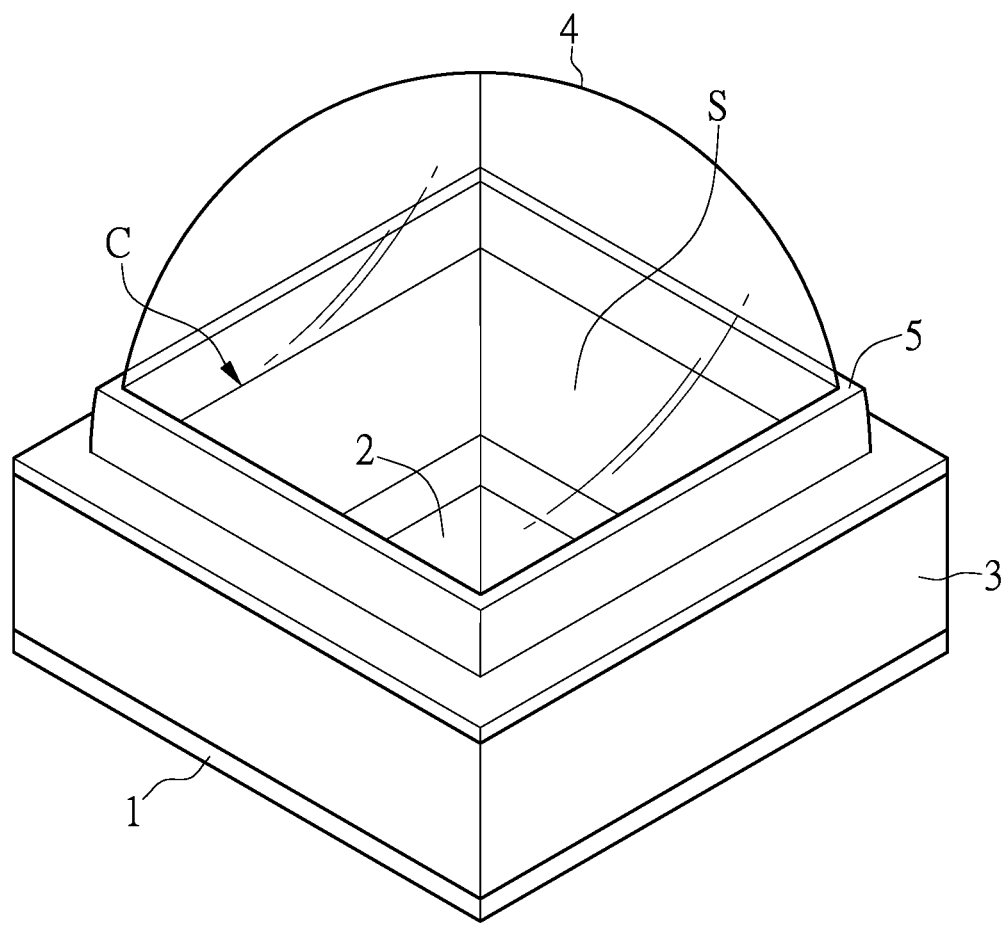
FIG. 2 is another perspective schematic view of the LED package structure of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 3:
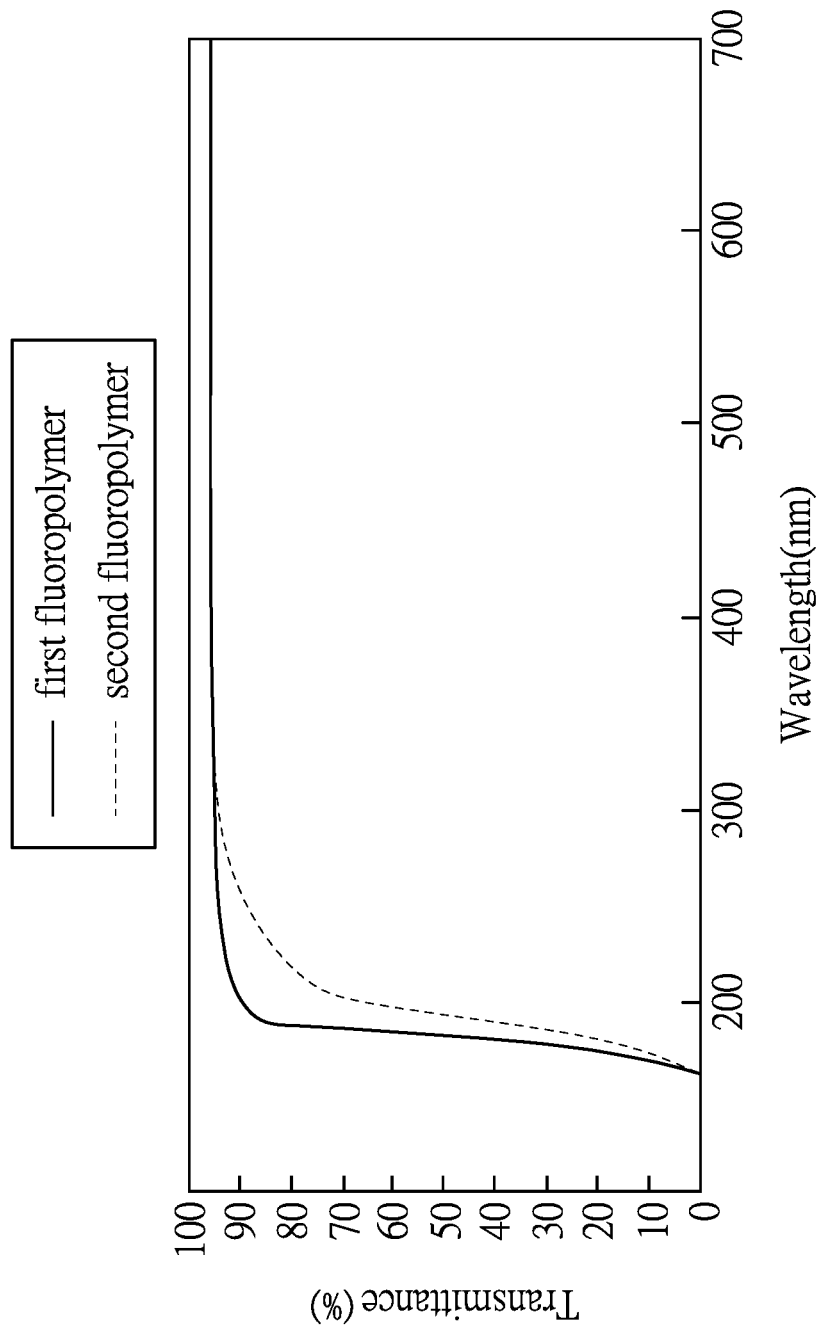
FIG. 3 is a correlation curve of a wavelength and the light transmittance of a first fluoropolymer and a second fluoropolymer of the present disclosure.
Figure 4:
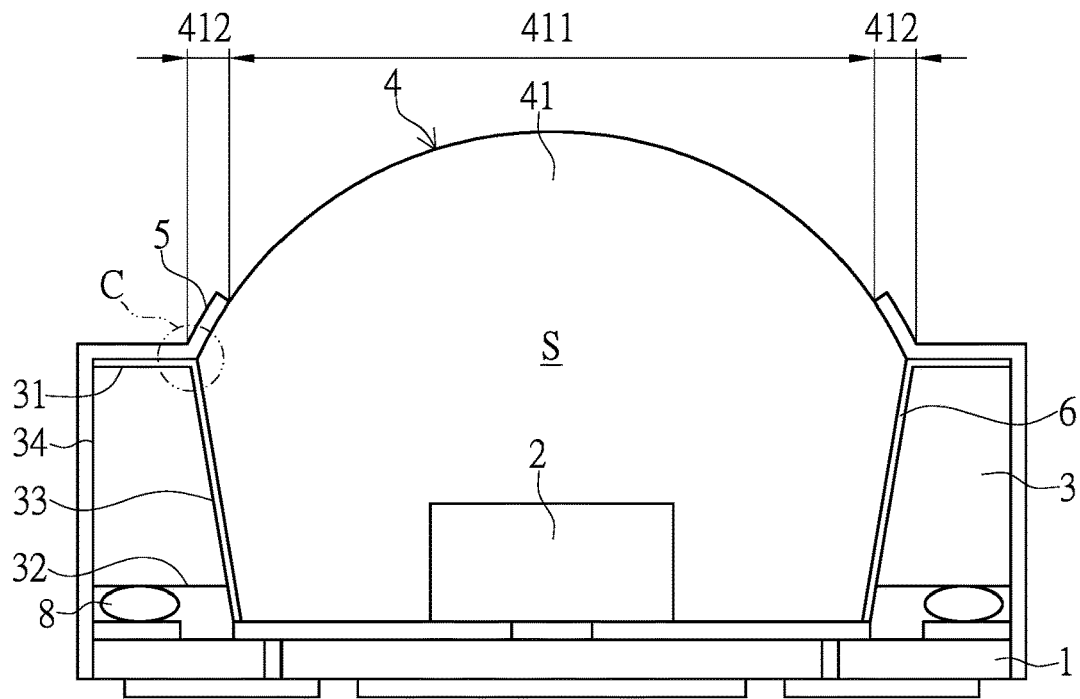
FIG. 4 is a structural schematic view of an implementation of the LED package structure in a first embodiment of the present disclosure.

Referring to FIG. 1 to FIG. 4, an LED package structure is provided by the present disclosure. The LED package structure includes a substrate 1, at least one LED 2, a side wall 3, an encapsulant 4, and a waterproof protective coating 5. Furthermore, the at least one LED 2 is disposed on the substrate 1, the side wall 3 defending a through hole S is disposed on the substrate 1, and the at least one LED 2 is accommodated in the through hole S. The encapsulant 4 is filled in the through hole S and covers the at least one LED 2. A heterojunction C is disposed between the encapsulant 4 and the side wall 3, and the waterproof protective coating 5 seals the heterojunction C (as shown in FIG. 4). Furthermore, the encapsulant 4 includes a first fluoropolymer, the waterproof protective coating 5 includes a second fluoropolymer, and the light transmittance of the first fluoropolymer is greater than the light transmittance of the second fluoropolymer.

Specifically speaking, the substrate 1 can be a conductive substrate or an insulated substrate, e.g., a ceramic substrate, an aluminum substrate, a silicon substrate, a silicon carbide substrate, an anodized aluminum substrate or an aluminum nitride substrate, etc. Preferably, the substrate 1 can be a nickel/gold processed aluminum nitride (AlN) substrate or a copper substrate. The at least one LED 2 of the present disclosure can be an ultra-violet (UV) LED, for example, an LED that emits light with a wavelength range of less than 400 nm, preferably an LED that emits light with a wavelength range of 200 nm to 400 nm. In practice, under the effect of surface tension, the adhesion of the encapsulant 4 relative to the side wall 3 is smaller than the cohesive force, thus causing the formation of an arc-shaped dome 41.

Furthermore, the second fluoropolymer is an amorphous fluoride, and the light transmittance of the first fluoropolymer is greater than that of the second fluoropolymer, regarding the light emitted by the LED 2. For example, for light with a wavelength of 275 nm, the refractive index of the first fluoropolymer is 1.354, and the refractive index of the second fluoropolymer is 1.33. As shown in FIG. 3, the light transmittance of the first fluoropolymer in the wavelength range of 265 nm to 285 nm is greater than 90%, and the light transmittance of the second fluoropolymer in the wavelength range of 265 nm to 285 nm is between 85% and 90%. Since the light transmittance of the first fluoropolymer is greater than that of the second fluoropolymer, when the molded part of the second fluoropolymer partially covers the molded part of the first fluoropolymer, the light intensity can avoid being significantly affected. Specifically speaking, the terminal functional group of the first fluoropolymer is trifluoromethyl ($CF_3$), and the terminal functional group of the second fluoropolymer is carboxyl group (COOH).

More specifically speaking, the first fluoropolymer has the following structure: $CF_3$—($CF_2$—$CFCF_2CF_2$—O—CF—$CF_2)_n$—$CF_3$, and n is a positive integer that is between 25 and $3 \times 10^5$. The second fluoropolymer has the following structure: COOH—(CF$_2$—CFCF$_2$CF$_2$—O—CF—CF$_2$)$_m$—COOH, and m is a positive integer that is between 18 and 1.5×10$^5$.

Preferably, the second fluoropolymer has a better adhesion to metal or ceramic than the first fluoropolymer. In other words, compared with the encapsulant 4, the waterproof protective coating 5 has a better adhesion to metal or ceramic, thus providing a better sealing effect for the heterojunction C between the package 4 and the side wall 3.

Furthermore, the following describes the implementations of the LED package structure of the present disclosure through the first, the second and the third embodiment, and further describes the materials and test results of the present disclosure through the fourth embodiment.

First Embodiment

Figure 5:
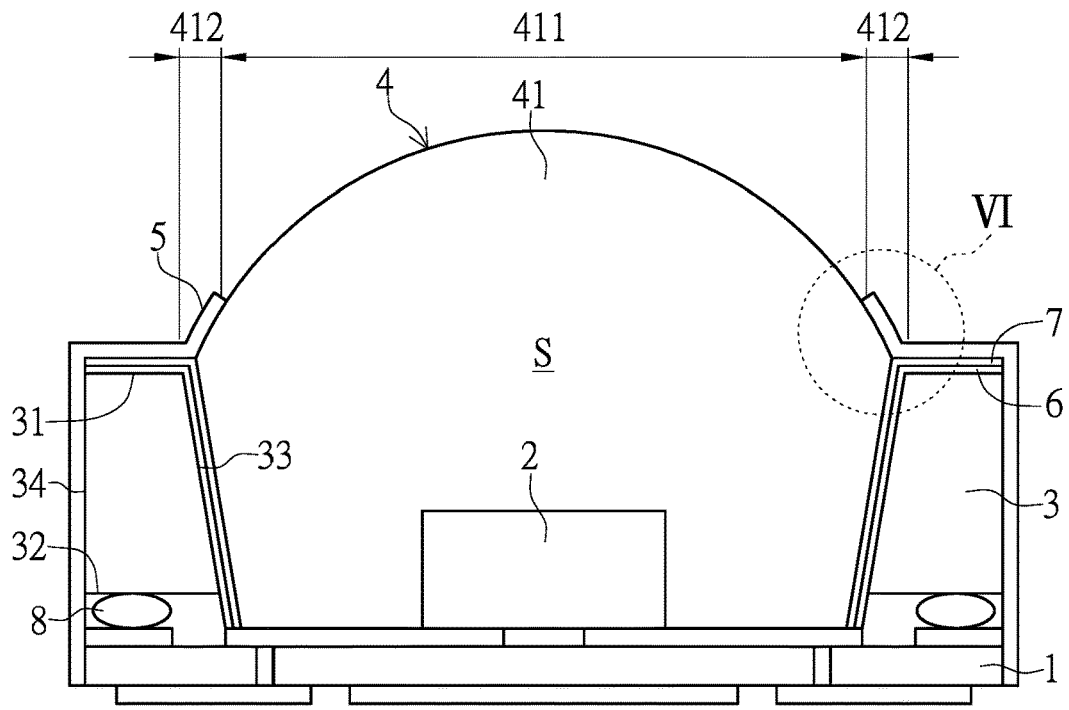
FIG. 5 is a structural schematic view of another implementation of the LED package structure in the first embodiment of the present disclosure.

Referring to FIG. 4 and FIG. 5, structural schematic views of implementations of the LED package structure in the first embodiment of the present disclosure are provided. The LED package structure of this embodiment includes a substrate 1, at least one LED 2, a side wall 3, an encapsulant 4, and a waterproof protective coating 5. The at least one LED 2 is disposed on the substrate 1, the side wall 3 defending a through hole S is disposed on the substrate 1, and the LED 2 is accommodated in the through hole S. The encapsulant 4 is filled in the through hole S and covers the at least one LED 2. A heterojunction C is disposed between the encapsulant 4 and the side wall 3, and the waterproof protective coating 5 seals the heterojunction C. It should be noted that a metal reflective layer 6 is formed on the side wall 3 of the LED package structure in this embodiment.

Furthermore, the diameter of the through hole S increases along with a direction away from the substrate 1. Specifically speaking, the side wall 3 has a first surface 31 that is distant from the substrate 1, a second surface 32 that is close to the substrate 1, an inner surface 33 connected therebetween, and an outer surface 34 opposite to the inner surface 33. The first surface 31 is higher than the upper light emitting surface (not shown in the figures) of the LED 2, and the area of the first surface 31 is smaller than that of the second surface 32. Preferably, the height of the side wall 3 is between 300 μm and 600 μm.

The encapsulant 4 has a dome 41 that protrudes out of the first surface 31. The waterproof protective coating 5 covers a part of the dome 41. More specifically speaking, the dome 41 has a central area 411 and a peripheral area 412 surrounding the central area 411. The coverage of the waterproof protective coating 5 includes the first surface 31 and the outer surface 34 of the side wall 3, the heterojunction C, and the peripheral area 412 of the dome 41. In other words, the waterproof protective coating 5 extends from the first surface 31 of the side wall 3 through the heterojunction C to the peripheral area 412 of the dome 41, and the central area 411 of the dome 41 is exposed from the waterproof protective coating 5. In some embodiments, the waterproof protective coating 5 can extend downward from the outer surface 34 of the side wall 3 to the periphery of the substrate 1.

As shown in FIG. 4, the metal reflective layer 6 can be formed on the inner surface 33 of the side wall 3, and can further extend onto the first surface 31 of the side wall 3 to be covered by the waterproof protective coating 5.

As shown in FIG. 5, in this embodiment, an anti-oxidation layer 7 can be formed on the metal reflective layer 6 in an arched manner as required. That is to say, the coverage of the anti-oxidation layer 7 and the coverage of the metal reflective layer 6 are identical.

In addition, as shown in FIG. 5, an adhesive layer 8 can be formed between the second surface 32 of the side wall 3 and the substrate 1. Since the waterproof protective coating 5 additionally extends from the outer surface 34 of the side wall 3 downward to the periphery of the substrate 1, the adhesive layer 8 can be protected by the waterproof protective coating 5 from moisture.

Figure 6:
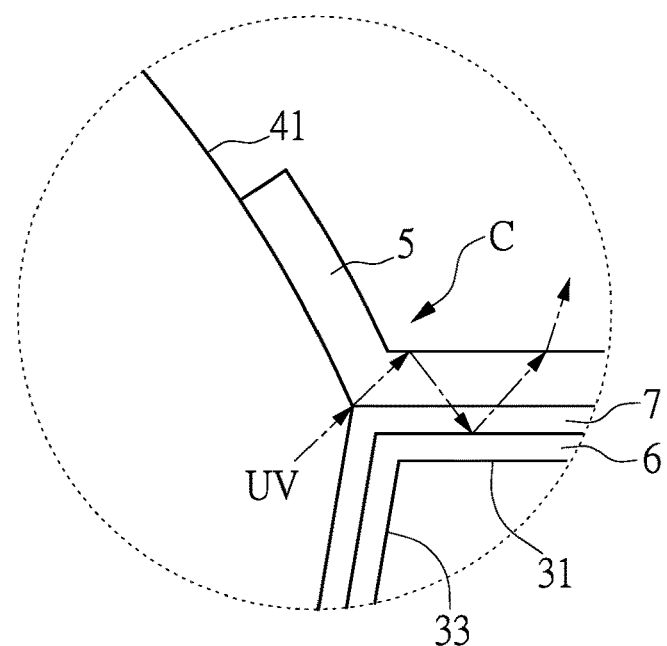
FIG. 6 shows an enlarged view of part VI of FIG. 5.

Referring to FIG. 6, since the waterproof protective coating 5 has a high light transmittance and the metal reflective layer 6 has a high reflectivity, the waterproof protective coating 5 and the metal reflective layer 6 can cooperate with each other above the first surface 31 of the side wall 3 so as to perform the "light guiding effect". Moreover, the light emitted by the LED 2 can enter the waterproof protective coating 5 through the heterojunction C, and after being continuously reflected between the upper surface of the waterproof protective coating 5 and that of the metal reflective layer 6, the light is output from the upper surface of the waterproof protective coating 5. In this manner, the luminous efficiency of the LED package structure can be increased by more than 2%.

Preferably, the material of the metal reflective layer 6 is a material with high reflectivity under light with a wavelength in the UV band, preferably selected from aluminum metal. In the related art, gold and aluminum oxide (Al$_2$O$_3$) are often used as the metal reflective layer 6, however, the metal reflective layer based on gold has a reflectivity of only about 37.8% under light with a wavelength in the UV band, and the metal reflective layer based on aluminum oxide also has a reflectivity of only about 45% under light with a wavelength in the UV band. In contrast, the aluminum-based metal reflective layer 6 has a reflectivity of about 92.3% under light with a wavelength in the UV band, which can greatly improve the reflection effect under light with a wavelength in the UV band. In addition, the material of the anti-oxidation layer 7 is selected from at least one or a combination of silica, hafnium dioxide, zirconium dioxide, and magnesium fluoride. For example, in this embodiment, the metal reflective layer 6 is an aluminum layer, and the anti-oxidation layer 7 is a silicon dioxide layer, and the present disclosure is not limited thereto.

Second Embodiment

Figure 7:
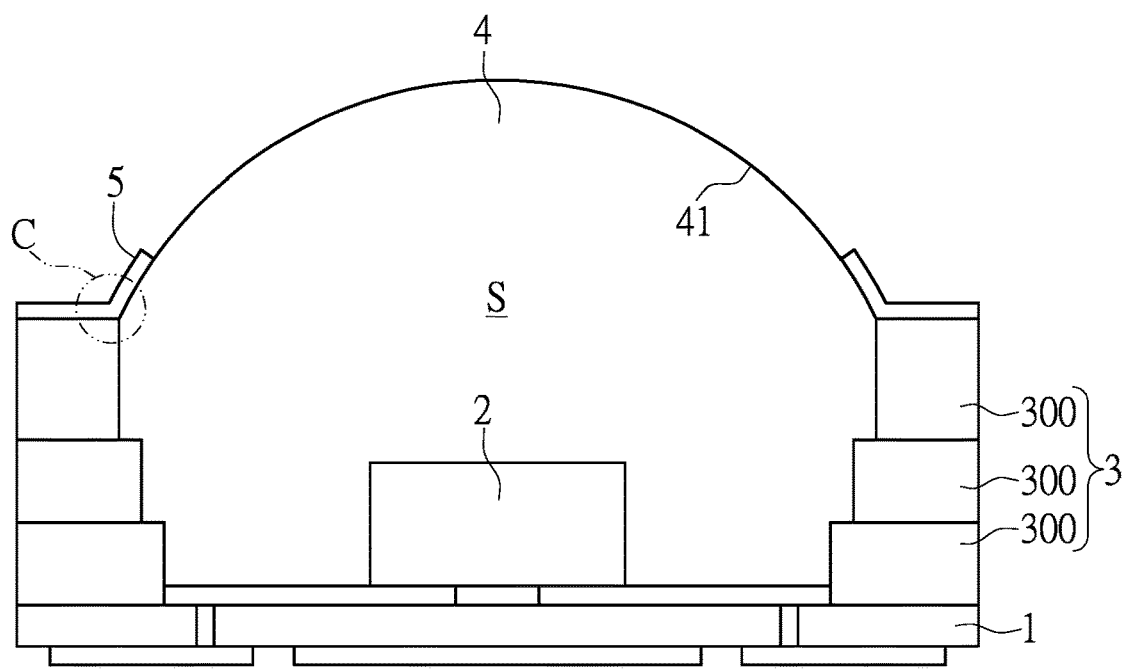
FIG. 7 is a structural schematic view of the LED package structure in a second embodiment of the present disclosure.

Referring to FIG. 7, a structural schematic view of the LED package structure in the second embodiment of the present disclosure is provided. The LED package structure of the second embodiment includes a substrate 1, at least one LED 2, a side wall 3, an encapsulant 4, and a waterproof protective coating 5. The at least one LED 2 is disposed on the substrate 1, the side wall 3 defending a through hole S is disposed on the substrate 1, and the LED 2 is accommodated in the through hole S. The encapsulant 4 is filled in the through hole S and covers the at least one LED 2. A heterojunction C is disposed between the encapsulant 4 and the side wall 3, and the waterproof protective coating 5 seals the heterojunction C.

The main difference between this embodiment and the first embodiment is that the side wall 3 is a stepped structure formed by stacking a plurality of reflection parts 300, and one of the reflection parts 300 that is close to the waterproof protective coating 5 has a smaller width than that of another reflective portion 300 of the substrate 1. It should be noted that the plurality of reflection parts 300 themselves have high reflectivity under light with a wavelength in the UV band, and do not need to have a metal reflective layer. Preferably, the height of the side wall 3 is between 200 μm and 600 μm, and more preferably, the height of the side wall 3 is 200 μm.

In this embodiment, a plurality of reflective parts 300 are formed on the substrate 1 by electroplating, thus no additional adhesive layer is required between the sidewall 3 and the substrate 1. In practice, the coverage of the waterproof protective coating 5 can only include the first surface 31 of the side wall 3, the heterojunction C, and the peripheral area 412 of the dome 41.

More specifically speaking, the material of the side wall 3 can be a metal having less activity than chromium or an alloy of the metal, e.g., iron, nickel, copper, silver, platinum, gold, or a combination thereof, and is preferably a nickel/gold alloy. It is worth mentioning that nickel/palladium/gold alloys are more commonly used as reflective materials in the art, where palladium is not easily oxidized under normal circumstances and do not lose luster in the air. However, palladium forms a layer of palladium oxide on its surface, and its color fades slightly in humid air containing sulfur. Due to the above mentioned considerations, nickel/gold alloy are selected to form the side wall 3 in the present disclosure, but the present disclosure is not limited thereto.

Third Embodiment

Figure 8:
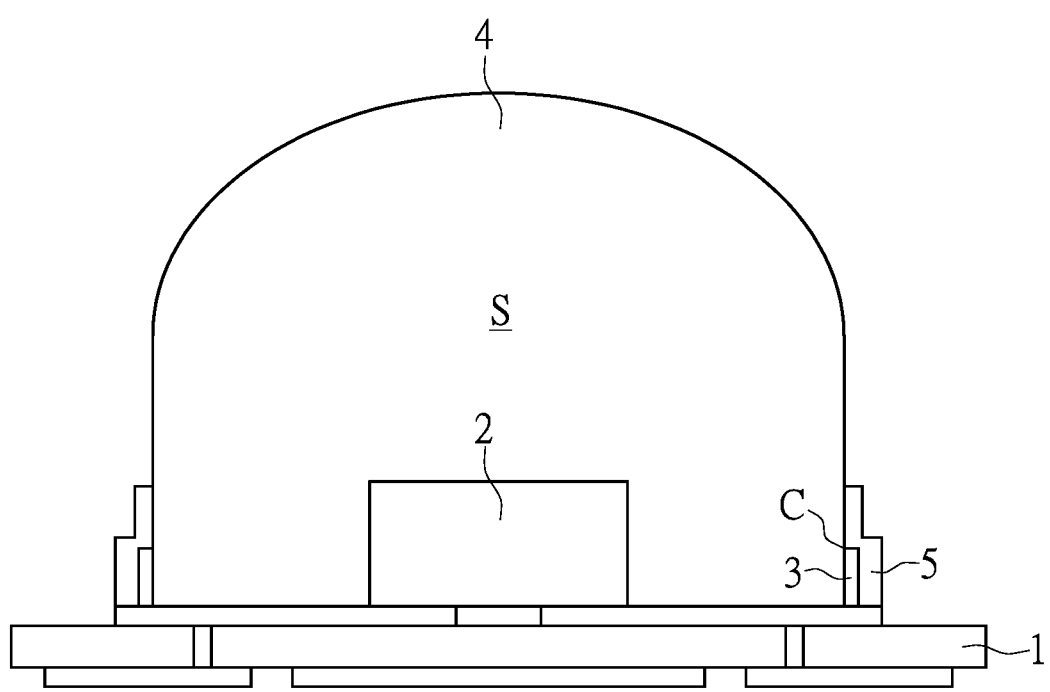
FIG. 8 is a structural schematic view of the LED package structure in a third embodiment of the present disclosure.

Referring to FIG. 8, a structural schematic view of the LED package structure in the third embodiment of the present disclosure is provided. The LED package structure of the third embodiment includes a substrate 1, at least one LED 2, a side wall 3, an encapsulant 4, and a waterproof protective coating 5. The at least one LED 2 is disposed on the substrate 1, the side wall 3 defending a through hole S is disposed on the substrate 1, and the LED 2 is accommodated in the through hole S. The encapsulant 4 is filled in the through hole S and covers the at least one LED 2. A heterojunction C is disposed between the encapsulant 4 and the side wall 3, and the waterproof protective coating 5 seals the heterojunction C.

In this embodiment, the first surface 31 of the side wall 3 is lower than the upper light emitting surface of the LED 2, and the waterproof protective coating 5 covers the entire side wall 3. Preferably, the material of the side wall 3 can be a metal or an alloy of the metal having less activity than chromium, such as iron, nickel, copper, silver, platinum, gold or a combination thereof, and preferably a nickel/gold alloy rather than a nickel/palladium/gold alloy.

Fourth Embodiment

Referring to Table 1, the quality test results of the LED package structures of Experimental Example 1 and Comparative Examples 1 to 7 are provided in this embodiment. Experimental Example 1 and Comparative Examples 1 to 7 use different materials as the encapsulant and the waterproof protective coating of the LED package structure. The materials are expressed as follows.

Fluoride X:

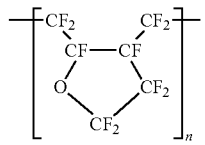

Fluoride Y:

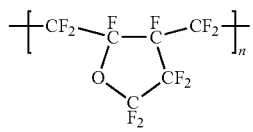

Fluoride Z:

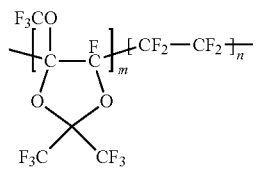

Fluoride P:

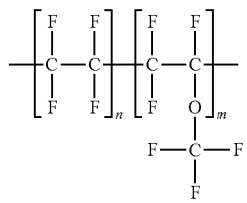

Fluoride Q:

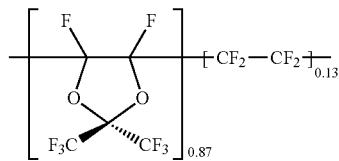

Fluoride R:

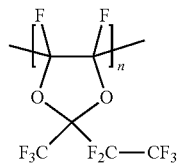

PDMS:

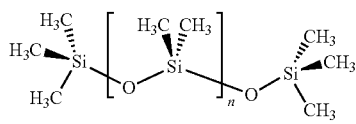

TABLE 1

The quality test results of the LED package structure of Experimental Example 1 and Comparative Examples 1 to 7

| Embodiment | Exp. 1 | Comp. 1 | Comp. 2 | Comp. 3 | Comp. 4 | Comp. 5 | Comp. 6 | Comp. 7 |
|---|---|---|---|---|---|---|---|---|
| Encapsulant | Fluoride X | Fluoride X | Fluoride P | PDMS | Fluoride X | Fluoride X | Fluoride X | Fluoride X |
| Waterproof protective | Fluoride Y | N/A | Fluoride Y | Fluoride Y | Fluoride Z | Fluoride Q | Fluoride R | SiO2 |

TABLE 1-continued

The quality test results of the LED package structure of Experimental Example 1 and Comparative Examples 1 to 7

| Embodiment | Exp. 1 | Comp. 1 | Comp. 2 | Comp. 3 | Comp. 4 | Comp. 5 | Comp. 6 | Comp. 7 |
|---|---|---|---|---|---|---|---|---|
| coating | | | | | | | | |
| Crack test | N/A | N/A | Cracks occur when >10 mW | Cracks occur when >5 mW | N/A | N/A | N/A | Cracks occur when >10 mW |
| Light transmittance (T %) (under 265 to 285 nm) | 94% | 94% | 94% | 94% | 40% | 91% | 93% | 91% |
| Waterproof protective coating refraction (n) (under 265 to 285 nm) | 1.38 | — | 1.38 | 1.38 | 1.35 | 1.39 | 1.33 | 1.49 |
| Waterproof protective coating adhesion* | 1 | N/A | 1 | 1 | 1 | 2 | 3 | 4 |
| Discoloration (under 260° C., 5 hr.) | pass | N/A | pass | pass | pass | pass | pass | failed |
| Quality and Reliability Assurance (QRA) (Temperature/ humidity 60° C./90%) | L70* 3000 hr. | 336 hr. short circuit occurs | L70 500 hr. | L70 336 hr. | L70 1500 hr. | L70 2500 hr. | L70 2000 hr. | L70 800 hr. |

*Waterproof layer adhesion test: The adhesion is tested according to the ASTM E229 standard, and the strength of the adhesion is indicated by numbers of 1 to 4.
*L70: Time required for the brightness to decay by 30%.

Specifically speaking, the waterproof protective coating of Experimental Example 1 has a good adhesion with the encapsulant and the side wall structure, thus having the best reliability in quality. Comparative Example 1 is not coated with a waterproof protective coating, so that the LED is easier to be penetrated by moisture that causes a short circuit. The LED package structures of Comparative Examples 2 and 3 have cracks when the luminous power is respectively greater than 10 mW and 5 mW, respectively, while the LED package structure of Comparative Example 4 has poor transmittance at a wavelength of 275 nm and has poor adhesion. The waterproof protective coatings of the LED package structures of Examples 5 and 6 have poor bonding force, and the refractive index of Fluoride R as the waterproof protective coating in Comparative Example 6 is 1.33, which does not match with that of Fluoride X as the encapsulant (1.38). The LED package structure of Comparative Example 7 uses the related art $SiO_2$ as a waterproof protective coating, which is easily discolored at high temperature, and cracks occur under the luminous power greater than 10 mW.

Fifth Embodiment

A method of making the LED package structure of the present disclosure is provided in this embodiment, including the following steps:

1. providing a substrate having a first surface and a second surface opposite to each other;
2. disposing at least one LED on the first surface of the substrate;
3. disposing a side wall on the first surface of the substrate, and the side wall having a through hole, so that the at least one LED is accommodated in the through hole;
4. filling an encapsulant in the through hole and covering the at least one LED, the encapsulant protruding from the side wall and forming an arc-shaped dome, and a heterojunction being disposed between the encapsulant and the side walls;
5. disposing a waterproof protective coating on the heterojunction surface.

One of the advantages of the present disclosure is that the LED package is able to effectively improve on the problem of wear and tear caused by the penetration of water vapor between the encapsulant and the side wall, and increases the luminous power, through the technical features of "the waterproof protective coating sealing the heterojunction" and "the material of the encapsulant including a first fluoropolymer, the material of the waterproof protective coating including a second fluoropolymer, and the light transmittance of the first fluoropolymer being greater than the light transmittance of the second fluoropolymer".

Moreover, the light transmittance of the first fluoropolymer in a wavelength range of 265 nm to 285 nm is greater than 90%, and the light transmittance of the second fluoropolymer in a wavelength range of 265 nm to 285 nm is between 85% and 90%. The refractive index of the first fluoropolymer is 1.354, and the refractive index of the second fluoropolymer is 1.33. Compared to the conventional package structures that includes quartz covers, by virtue of the above mentioned light transmittance and refractive index, the LED package structure provided by the present disclosure is able to increase the luminous power for approximately 40%, thus improving on the problem of wear and tear caused by the penetration of water vapor between the encapsulant and the side wall.

The LED package structure of the present disclosure can further include a metal reflective layer and/or an anti-oxidation layer. After the light emitted by the LED passes through the heterojunction C through the "photoconductivity effect", the light is then reflected by the waterproof protective coating to the metal reflective layer and then reflected out of the waterproof protective coating, which further increases the luminous efficiency of the LED package structure by more than 2%.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light-emitting diode (LED) package structure, comprising:
    a substrate;
    at least one LED disposed on the substrate;
    a side wall defending a through hole disposed on the substrate, and the at least one LED being accommodated in the through hole; wherein the side wall has a first surface that is distant from the substrate, a second surface that is close to the substrate, and an inner surface that is connected between the first surface and the second surface;
    a metal reflective layer disposed on the inner surface of the side wall and extending to the first surface;
    an encapsulant being filled in the through hole and covering the at least one LED, wherein a heterojunction is disposed between the encapsulant and the side wall; and
    a waterproof protective coating sealing the heterojunction;
    wherein the encapsulant includes a first fluoropolymer, the waterproof protective coating includes a second fluoropolymer, and a light transmittance of the first fluoropolymer is greater than a light transmittance of the second fluoropolymer;
    wherein the LED package structure has a central area and a peripheral area surrounding the central area, and the waterproof protective coating covers the metal reflective layer and extends through the heterojunction and to the peripheral area.

2. The LED package structure according to claim 1, wherein the at least one LED emits light with a wavelength range of 200 nm to 400 nm.

3. The LED package structure according to claim 1, wherein the light transmittance of the first fluoropolymer in a wavelength range of 265 nm to 285 nm is greater than 90%, and the light transmittance of the second fluoropolymer in a wavelength range of 265 nm to 285 nm is between 85% and 90%.

4. The LED package structure according to claim 1, wherein the first fluoropolymer is represented by the following structure:

$$CF_3-(CF_2-CFCF_2CF_2-O-CF-CF_2)_n-CF_3;$$

wherein n is a positive integer that is between 25 and $3\times10^5$.

5. The LED package structure according to claim 1, wherein the second fluoropolymer is represented by the following structure:

$$COOH-(CF_2-CFCF_2CF_2-O-CF-CF_2)_m-COOH;$$

wherein m is a positive integer that is between 18 and $1.5\times10^5$.

6. The LED package structure according to claim 1, wherein the light of the at least one LED is emitted to the waterproof protective coating, and then reflected to the metal reflective layer by the waterproof protective coating.

7. The LED package structure according to claim 1, wherein the encapsulant has a dome that protrudes out of the first surface.

8. The LED package structure according to claim 7, wherein the waterproof protective coating covers a part of the dome and exposes another part of the dome.

9. The LED package structure according to claim 1, further comprising an anti-oxidation layer that is disposed on the metal reflective layer.

10. The LED package structure according to claim 9, wherein the material of the anti-oxidation layer is selected from at least one of silica, hafnium dioxide, zirconium dioxide, and magnesium fluoride.

11. The LED package structure according to claim 1, further including an adhesive layer disposed between the second surface of the side wall and the substrate.

12. The LED package structure according to claim 11, wherein the side wall includes an outer surface that is connected between the first surface and the second surface and opposite to the inner surface; wherein, the waterproof protective coating covers the outer surface and extends to seal the adhesive layer.

13. The LED package structure according to claim 1, wherein the side wall is formed by stacking a plurality of reflecting parts, and the widths of the reflecting parts that are closer to the waterproof protective coating are smaller than the widths of the reflecting parts that are closer to the substrate.

14. The LED package structure according to claim 13, wherein the side wall includes nickel/gold alloy.

15. The LED package structure according to claim 1, wherein the height of the side wall is less than the height of the at least one LED, and the waterproof protective coating covers the side wall.

16. The LED package structure according to claim 15, wherein the side wall includes nickel/gold alloy.

* * * * *